United States Patent
Kim (10) Patent No.: US 8,044,679 B2
(45) Date of Patent: Oct. 25, 2011

(54) ON-DIE TERMINATION CONTROL CIRCUIT OF SEMICONDUCTOR MEMORY DEVICE

(75) Inventor: Kyung-Whan Kim, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 578 days.

(21) Appl. No.: 12/128,158

(22) Filed: May 28, 2008

(65) Prior Publication Data

US 2009/0222637 A1 Sep. 3, 2009

(30) Foreign Application Priority Data

Mar. 3, 2008 (KR) .................. 10-2008-0019663

(51) Int. Cl.
*H03K 17/16* (2006.01)
*H03K 19/003* (2006.01)
*H01P 5/08* (2006.01)
*H03H 7/38* (2006.01)

(52) U.S. Cl. ............ 326/30; 327/108; 333/17.3; 333/32

(58) Field of Classification Search .................... 326/26, 326/27, 30, 86, 87; 327/108, 109; 365/202, 365/198.51, 189.07, 225.7; 333/17.3, 32, 333/34

See application file for complete search history.

(56) References Cited

U.S. PATENT DOCUMENTS

| 7,365,564 | B2 * | 4/2008 | Kim ................................. 326/30 |
| 2007/0126468 | A1* | 6/2007 | Kim ................................. 326/30 |
| 2008/0054936 | A1* | 3/2008 | Fujisawa ........................ 326/30 |
| 2009/0016124 | A1* | 1/2009 | Kim .............................. 365/194 |
| 2009/0115450 | A1* | 5/2009 | Kim et al. ..................... 326/30 |
| 2010/0001762 | A1* | 1/2010 | Kim ................................. 326/93 |
| 2010/0207680 | A1* | 8/2010 | Kuwahara et al. ............ 327/520 |
| 2010/0208534 | A1* | 8/2010 | Fujisawa ...................... 365/193 |

FOREIGN PATENT DOCUMENTS

| KR | 1020070036635 A | 4/2007 |
| KR | 1020080114086 A | 12/2008 |

* cited by examiner

*Primary Examiner* — Shawki Ismail
*Assistant Examiner* — Dylan White
(74) *Attorney, Agent, or Firm* — IP & T Group LLP (57) ABSTRACT

On-die termination control circuit of semiconductor memory device includes a counter configured to count an external clock to output a first code, and to count an internal clock to output a second code, a transfer controller configured to determine whether to transfer the first code and the second code in response to a first termination command and a normal termination controller configured to compare the first code and the second code with each other to determine enabling/disabling timings of a termination operation in response to a second termination command.

16 Claims, 10 Drawing Sheets

ON-DIE TERMINATION CONTROL CIRCUIT OF SEMICONDUCTOR MEMORY DEVICE

CROSS-REFERENCE TO RELATED APPLICATIONS

The present invention claims priority of Korean patent application number 10-2008-0019663, filed on Mar. 3, 2008, which is incorporated by reference in its entirety.

BACKGROUND OF THE INVENTION

The present invention relates to an on die termination (ODT) control circuit configured to control ODT operation of a semiconductor memory device, and more particularly, to an ODT control circuit with low power consumption.

With increasing capacity/speed of semiconductor memory devices, particularly DRAMs, and the advent of double data rate (DDR) synchronous DRAMs (SDRAMs), new technical ideas have been suggested to increase a transmission rate in memory devices. As one of various technical ideas, a termination resistor is required to enhance signal transmission between devices.

If impedance is not matched properly, a transmitted signal may be reflected, leading to an error of signal transmission. If, however, a fixed resistor is employed, the impedance cannot be properly matched due to degradation of an integrated circuit (IC), temperature variation or fabrication process variation. Therefore, to compare the resistance of a termination resistor with that of an external reference resistor and make them equal to each other, an impedance matching technology recently has been proposed, which controls a termination resistor by adjusting the number of turned-on transistors among a plurality of transistors connected in parallel.

An on-die termination (ODT) control circuit is a circuit to be used for controlling enabling/disabling timings of ODT operation, that is, enabling/disabling timings of an ODT circuit. Such an ODT control circuit is disclosed in Korean Patent Registration No. 10-0625298.

According to the JEDEC standard, dynamic termination operation must be supported in DDR3 SDRAMs or high-grade memory devices. The dynamic termination operation is the operation of setting a termination resistor in a chip to have a predetermined resistance required to input data when a write command is input even though a mode register set (MRS) is not set again.

A data-input interface of a semiconductor memory device differs in the termination method and resistance of a termination resistor from a data-output interface. When data are output, an input/output pad, e.g., DQ pad, is pull-up or pull-down terminated to output data of logic 'High' or 'Low'. In contrast, when data are input, the semiconductor memory device receives the data in a state that the input/output pad is pull-up and pull-down terminated to a predetermined resistance, which differs from the resistance when the data are output. Termination schemes in data input/output may be differently designed depending on a kind of a memory device. In DDR3 SDRAMs or high-grade memory devices supporting dynamic termination operation, an ODT circuit inside a chip appositely operates just by receiving a write command.

That is, ODT control circuits before the advent of DDR3 memory devices played a role in simply controlling the ODT circuit to be enabled/disabled, however, dynamic termination operation must be added to DDR3 SDRAMs or high-grade memory devices.

Therefore, the ODT control circuit used in DDR3 memory devices controls enabling/disabling of normal termination operation and enabling/disabling of dynamic termination operation.

Figure 1:
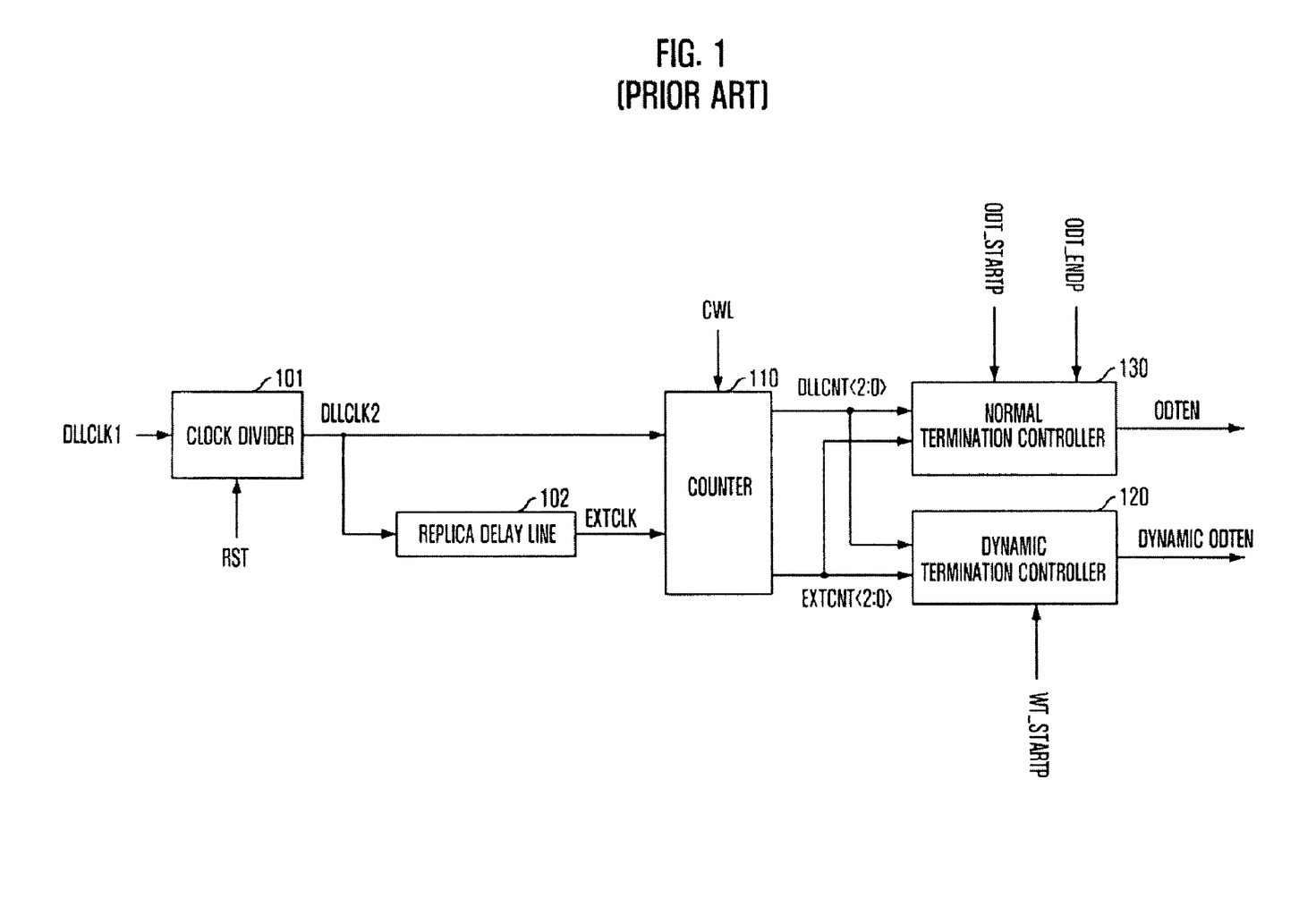
FIG. 1 is a block diagram of a conventional on-die termination (ODT) control circuit configured to control normal termination operation and dynamic termination operation.

FIG. 1 is a block diagram of a conventional ODT control circuit configured to control normal termination operation and dynamic termination operation.

Referring to FIG. 1, the conventional ODT circuit includes a counter 110, a normal termination controller 130, a dynamic termination controller 120, a clock divider 101, and a replica delay line 102. The counter 110 counts an external clock EXTCLK to output a first code EXTCNT<2:0>, and counts an internal clock DLLCLK2 to output a second code DLLCNT<2:0>. The normal termination controller 130 compares the first code EXTCNT<2:0> and the second code DLLCNT<2:0> with each other to determine enabling/disabling timings of normal termination operation in response to termination commands ODT_STARTP and ODT_ENDP. The dynamic termination controller 120 compares the first code EXTCNT<2:0> and the second code DLLCNT<2:0> with each other to determine enabling/disabling timings of dynamic termination operation in response to a write command WT_STARTP. The clock divider 101 supplies the internal clock DLLCLK2 to the ODT control circuit. The replica delay line 102 receives the internal clock DLLCLK2 to generate the external clock EXTCLLK.

The clock divider 101 and the replica delay line 102, which respectively supply the internal clock DLLCLK2 and the external clock EXTCLK to the ODT control circuit, will be described first below.

The clock divider 101 receives an internal clock DLLCLK1 supplied through a delay locked loop (DLL), and prevents the internal clock DLLCLK2 from toggling until a reset RST is deactivated. The clock divider 101 outputs the internal clock DLLCLK2, which is toggling, when the reset signal RST is deactivated. The internal clock DLLCLK2 is the same as the internal clock DLLCLK1 except that the internal clock DLLCLK2 does not toggle until the reset signal RST is deactivated.

The replica delay line 102 models a clock skew between the internal clock DLLCLK and the external clock EXTCLK. The replica delay line 102 reflects the clock skew in the internal clock DLLCLK, and then outputs the external clock EXTCLK.

The counter 110 counts the external clock EXTCLK to output the first code EXTCNT<2:0>, and counts the internal clock DLLCLK2 to output the second code DLLCNT<2:0>. Herein, the first and second codes EXTCNT<2:0> and DLLCNT<2:0> are a binary code. The first code EXTCNT<2:0> is counted from its initial value '0', however, the second code DLLCNT<2:0> has a specific initial value that is determined according to a CAS write latency (CWL). Since the CWL itself is regulated in a specification such that it has a limited value according to an operating frequency, the specific initial value of the second code DLLCNT<2:0> is determined according to the operating frequency.

The dynamic termination controller 120 controls dynamic termination operation. The dynamic termination controller 120 is responsive to the write command WT_STARTP to store the first code EXTCNT<2:0> at a timing when the write command WT_STARTP is activated. The write command WT_STARTP is generated from a write command, which will be described later. The dynamic termination controller 120 compares a stored value of the first code EXTCNT<2:0> and a value of the second code DLLCNT<2:0> to thereby enable the dynamic termination operation at a timing when the values of the two codes are equal to each other. Here, the value of the first code EXTCNT<2:0> does not vary because it is the stored value, but the value of the second code DLLCNT<2:0> increases because it is continuously counted. The dynamic termination operation is disabled at a timing when the sum of the value of the first code EXTCNT<2:0> and a predetermined value determined according to a burst length (BL) of the stored first code EXTCNT<2:0> is equal to the value of the second code DLLCNT<2:0>. Since the value of the stored value of the first code EXTCNT<2:0> is a constant value, the value of the first code EXTCNT<2:0> with the predetermined value added is also a constant value. Operation of the dynamic termination controller 120 will be described in detail with reference to the accompanying drawings later.

The normal termination controller 130 controls normal termination operation. That is, the normal termination controller 130 controls a normal termination operation in response to the termination commands ODT_STARTP and ODT_ENDP provided from an external memory controller. Herein, the termination commands ODT_STARTP and ODT_ENDP are generated by an external command. Operation of the normal termination controller 130 will also be described in detail with reference to the accompanying drawings later.

Figure 2:
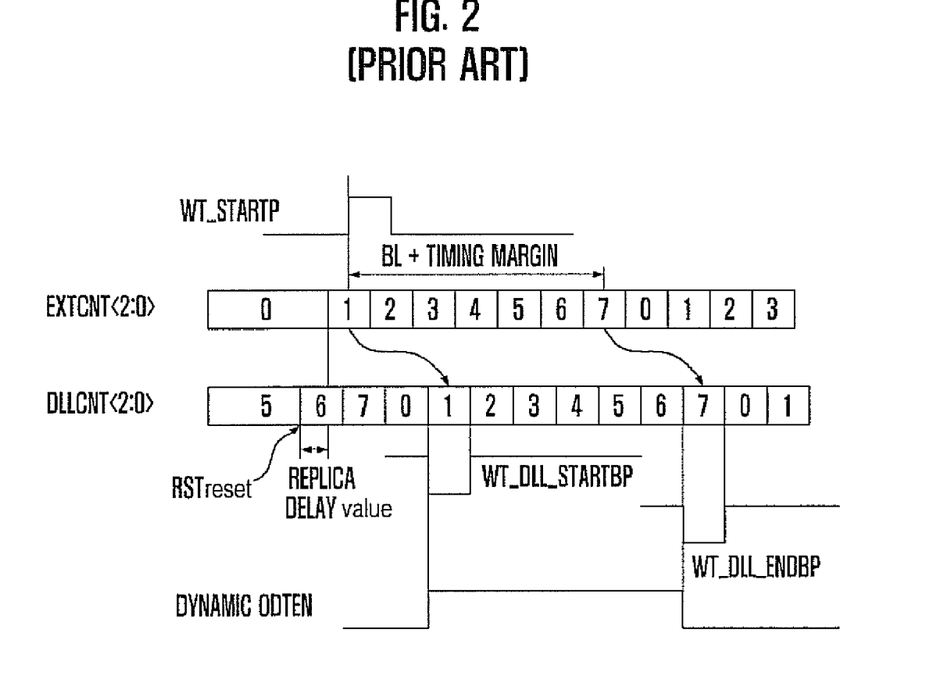
FIG. 2 illustrates operation of a dynamic termination controller 120 in FIG. 1.

FIG. 2 illustrates the operation of the dynamic termination controller 120 in FIG. 1.

First, since the internal clock DLLCLK2 and the external clock EXTCLK do not toggle before the reset signal RST is deactivated, the first and second codes EXTCNT<2:0> and DLLCNT<2:0> are not counted but fixed to respective initial values. From FIG. 2, it can be observed that the first code EXTCNT<2:0> has the initial value of 0, and the second code DLLCNT<2:0> has the initial value of 5. As described above, the initial value of the second code DLLCNT<2:0> is determined according to CWL. When the reset signal RST is deactivated, the first and second codes EXTCNT<2:0> and DLLCNT<2:0> start to be counted. The counting of the first code EXTCNT<2:0> is performed later than the counting of the second code DLLCNT<2:0> because the external clock EXTCLK is generated by delaying the internal clock DLLCLK2.

Meanwhile, when a write command is input from the outside, the WT_STARTP pulse signal is activated in response to the write command. The first code EXTCNT<2:0> at an enabling timing of the WT_STARTP pulse signal is stored (1 is stored in FIG. 2). A WT_DLL_STARTBP signal is activated to a logic low level when the value of the second code DLLCNT<2:0> is equal to the stored value of the first code EXTCNT<2:0>, i.e., 1. The WT_DLL_STARTBP signal activates a DYNAMIC OTEN signal used to control the dynamic termination operation, which initiates the dynamic termination operation.

How to finish the dynamic termination operation will be described below. A predetermined value is added to the stored value of the first code EXTCNT<2:0>, i.e., 1, according to a burst length BL in response to the write command. Since eight data are input at rising/falling edges of a clock when the burst length is 8, four clocks are required. In consideration of a timing margin, however, six clocks are required in totality, which is regulated in a specification. When the burst length is 4, four clocks are required in totality because two clocks are used for data input and the other two clocks are used for a timing margin, which is also regulated in a specification.

Therefore, when the burst length is 8, the value of 6 is added to the stored value of the first code EXTCNT<2:0>, i.e., 1. In FIG. 2, the burst length is 8 and thus the added value equals to 7, that is, 1+6=7. When the burst length is 4, the value of 4 is added to the stored value of the first code EXTCNT<2:0>. That is, when the burst length is assumed to be BL, the value of (BL/2)+2 is added to the stored value of the first code EXTCNT<2:0>. Thereafter, the value of the first code EXTCNT<2:0> with the predetermined value added is compared with the value of the second code DLLCNT<2:0>. At a timing when the value, i.e., 7, of the first code EXTCNT<2:0> with the predetermined value added is equal to the value of the second code DLLCNT<2:0>, a WT_DLL_ENDBP signal is activated to a logic low level, which deactivates the DTNAMIC ODTEN signal so that the dynamic termination operation is finished.

In this way, the conventional dynamic termination controller 120 enables the dynamic termination operation after a predetermined time from the input of the write command. After securing a time necessary for data input and a predetermined margin, the dynamic termination is disabled.

Figure 3:
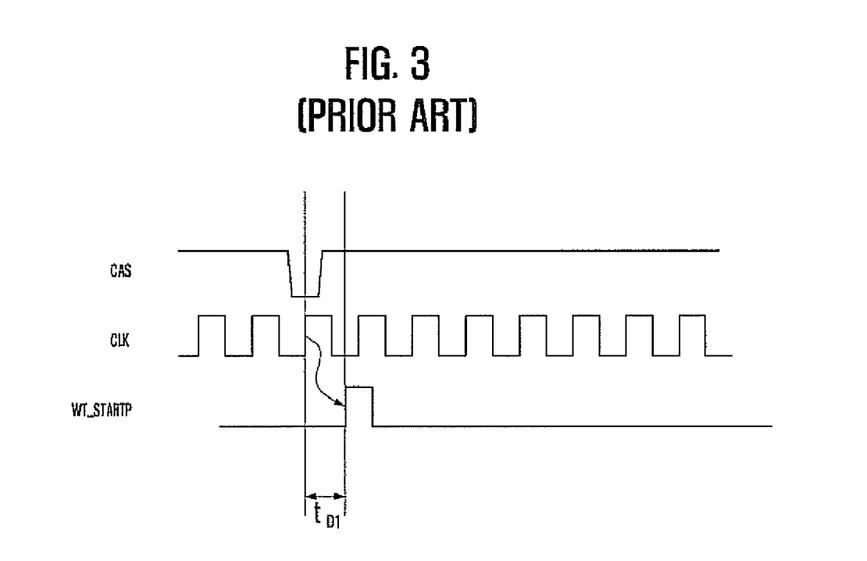
FIG. 3 is a timing diagram illustrating a WT_STARTP pulse signal in FIG. 2.

FIG. 3 is a timing diagram illustrating the WT_STARTP pulse signal in FIG. 2.

The WT_STARTP pulse signal is basically activated in response to a write command. As illustrated in FIG. 3, a column address strobe (CAS) command corresponding to the write command is input, and then the WT_STARTP pulse signal is activated after a predetermined time, i.e., after an additive latency (AL). Herein, since the CAS command corresponds to the write command, the CAS command is input while a write enable signal WE is activated.

In detail, when an external CAS command corresponding to the write command is input, a command input buffer receives the CAS command in synchronization with a clock CLK. Thereafter, the CAS command is delayed by a predetermined delay time $t_{D1}$ in an internal circuit, and then the WT_STARTP pulse signal is activated. That is, the write pulse signal WT_STARTP may be generated by delaying the write command from the outside by a predetermined delay time. For reference, a pulse width of the WT_STARTP pulse signal may be properly set in consideration of a margin.

Figure 4:
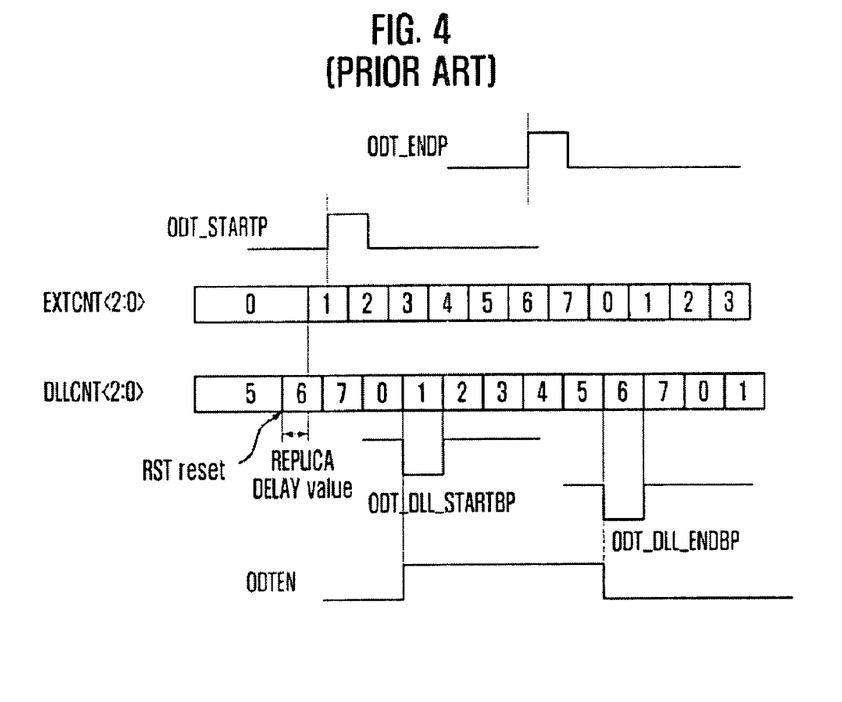
FIG. 4 illustrates operation of a normal termination controller 130 in FIG. 1.

FIG. 4 illustrates operation of the normal termination controller 130 in FIG. 1.

First, since the internal clock DLLCLK2 and the external clock EXTCLK do not toggle before the reset signal RST is deactivated, the first and second codes EXTCNT<2:0> and DLLCNT<2:0> are not counted but fixed to respective initial values. From FIG. 4, it can be observed that the first code EXTCNT<2:0> has the initial value of 0, and the second code DLLCNT<2:0> has the initial value of 5. As described above, the initial value of the second code DLLCNT<2:0> is determined according to CWL. When the reset signal RST is deactivated, the first and second codes EXTCNT<2:0> and DLLCNT<2:0> start to be counted. The counting of the first code EXTCNT<2:0> is performed later than the counting of the second code DLLCNT<2:0> because the external clock EXTCLK is generated by delaying the internal clock DLLCLK2.

Meanwhile, an ODT_STARTP signal is activated, which is generated by a termination command of an external memory controller (also referred to as a 'chipset'). The first code EXTCNT<2:0> at an enabling timing of the ODT_STARTP signal is stored (1 is stored in FIG. 4). An ODT_DLL_STARTBP signal is activated to a logic low level when the value of the second code DLLCNT<2:0> is equal to the stored value of the first code EXTCNT<2:0>, i.e., 1. This ODT_DLL_STARTBP signal activates an ODTEN signal used to control normal termination operation, which initiates the normal termination operation. The normal termination operation means a typical termination operation, not the dynamic termination operation.

The finish of the normal termination operation is performed in the same manner as the initiation of the normal termination operation. The value of the first code EXTCNT<2:0> at an enabling timing of the ODT_ENDP signal generated by the termination command of the external memory controller is stored, for example, the value of 6 is stored in FIG. 4. When the value of the second code DLLCNT<2:0> is equal to the stored value of the first code EXTCNT<2:0>, e.g., 6, an ODT_DLL_ENDBP signal is activated to a logic low level, which deactivates the ODTEN signal used to control the normal termination operation. Finally, the normal termination operation is finished.

That is, both the initiation and finish of the normal termination operation are controlled by the external memory controller.

Figure 5:
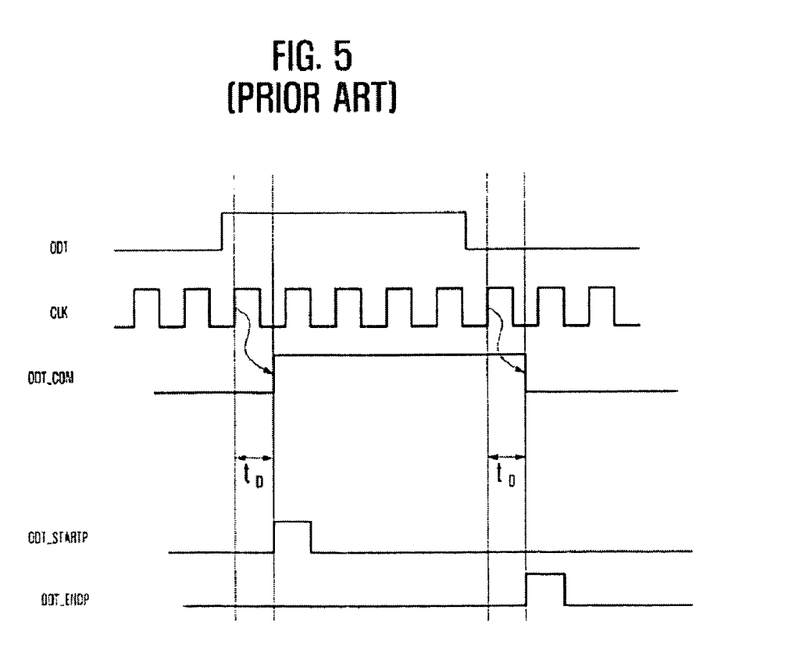
FIG. 5 is a timing diagram illustrating ODT_STARTP and the ODT_ENDP signals.

FIG. 5 is a timing diagram illustrating the ODT_STARTP signal and the ODT_ENDP signal.

The ODT_STARTP signal and the ODT_ENDP signal are basically generated by a command from the external memory controller. The termination command ODT is applied from the memory controller so as to satisfy setup/hold conditions. The termination command ODT is synchronized with an internal clock and then delayed by a predetermined time, i.e., additive latency (AL), thereby generating an ODT_COM signal. The ODT_STARTP signal and the ODT_ENDP signal are respectively activated at the enabling and disabling timings of the ODT_COM signal. Here, the ODT_STARTP signal and the ODT_ENDP signal are pulse-type signals.

As described above, the conventional ODT control circuit compares the first code EXTCNT<2:0> generated by counting the external clock EXTCLK with the second code DLLCNT<2:0> generated by counting the internal clock DLLCLK2, thus controlling the normal termination operation and the dynamic termination operation. Such a conventional ODT control circuit keeps on counting the external clock EXTCLK and the internal clock DLLCLK2 to generate the first code EXTCNT<2:0> and the second code DLLCNT<2:0>. Accordingly, the counter 110 consumes current continuously.

Furthermore, since the first and second codes EXTCNT<2:0> and DLLCNT<2:0>, which are continuously toggling, i.e., varying, are input into the normal termination controller 130 and the dynamic termination controller 120 for comparison, gate terminals of logic gates in the normal termination controller 130 and the dynamic termination controller 120 are charged and discharged continuously, thus always giving rise to a dynamic current consumption. This means that a memory device unnecessarily consumes power even in a stand-by mode.

For reference, dynamic power consumption means power consumption caused by charging/discharging of loading capacitors while a circuit is operating. More particularly, dynamic power consumption means power consumption occurring while capacitors at gate terminals are being charged and discharged periodically due to continuous toggling of the first and second codes EXTCNT and DLLCNT<2:0>.

Recently, there has been increasing demand for a low-power semiconductor memory device. In particular, power consumption in a stand-by mode may basically affect power consumption of all operating modes, and thus technology for reducing power consumption in a stand-by mode is a critical issue in semiconductor memory devices.

SUMMARY OF THE INVENTION

Embodiments of the present invention are directed to providing an on-die termination (ODT) control circuit with low power consumption.

In accordance with a first aspect of the present invention, there is provided a counter configured to count an external clock to output a first code, and to count an internal clock to output a second code, a transfer controller configured to determine whether to transfer the first code and the second code in response to a first termination command and a normal termination controller configured to compare the first code and the second code with each other to determine enabling/disabling timings of a termination operation in response to a second termination command.

In accordance with a second aspect of the present invention, there is provided a counter configured to count an external clock to output a first code, and to count an internal clock to output a second code, a transfer controller configured to be responsive to a first write command to transfer the first code and the second code for a predetermined time after the first write command, and a dynamic termination controller configured to compare the first code and the second code with each other to determine enabling/disabling timings of a dynamic termination operation in response to a second write command.

In accordance with a third aspect of the present invention, there is provided a counter configured to count an external clock to output a first code, and to count an internal clock to output a second code, a transfer controller configured to determine whether to transfer the first code and the second code in response to a first termination command, and to be responsive to a first write command to transfer the first code and the second code for a predetermined time after the first write command is input, a normal termination controller configured to compare the first code and the second code transferred from the transfer controller with each other to determine enabling/disabling timings of a termination operation in response to a second termination command, and a dynamic termination controller configured to compare the first code and the second code transferred from the transfer controller with each other to determine enabling/disabling timings of a dynamic termination operation in response to a second write command.

DESCRIPTION OF SPECIFIC EMBODIMENTS

Hereinafter, an on-die termination (ODT) control circuit of semiconductor memory device in accordance with the present invention will be described in detail with reference to the accompanying drawings.

Figure 6:
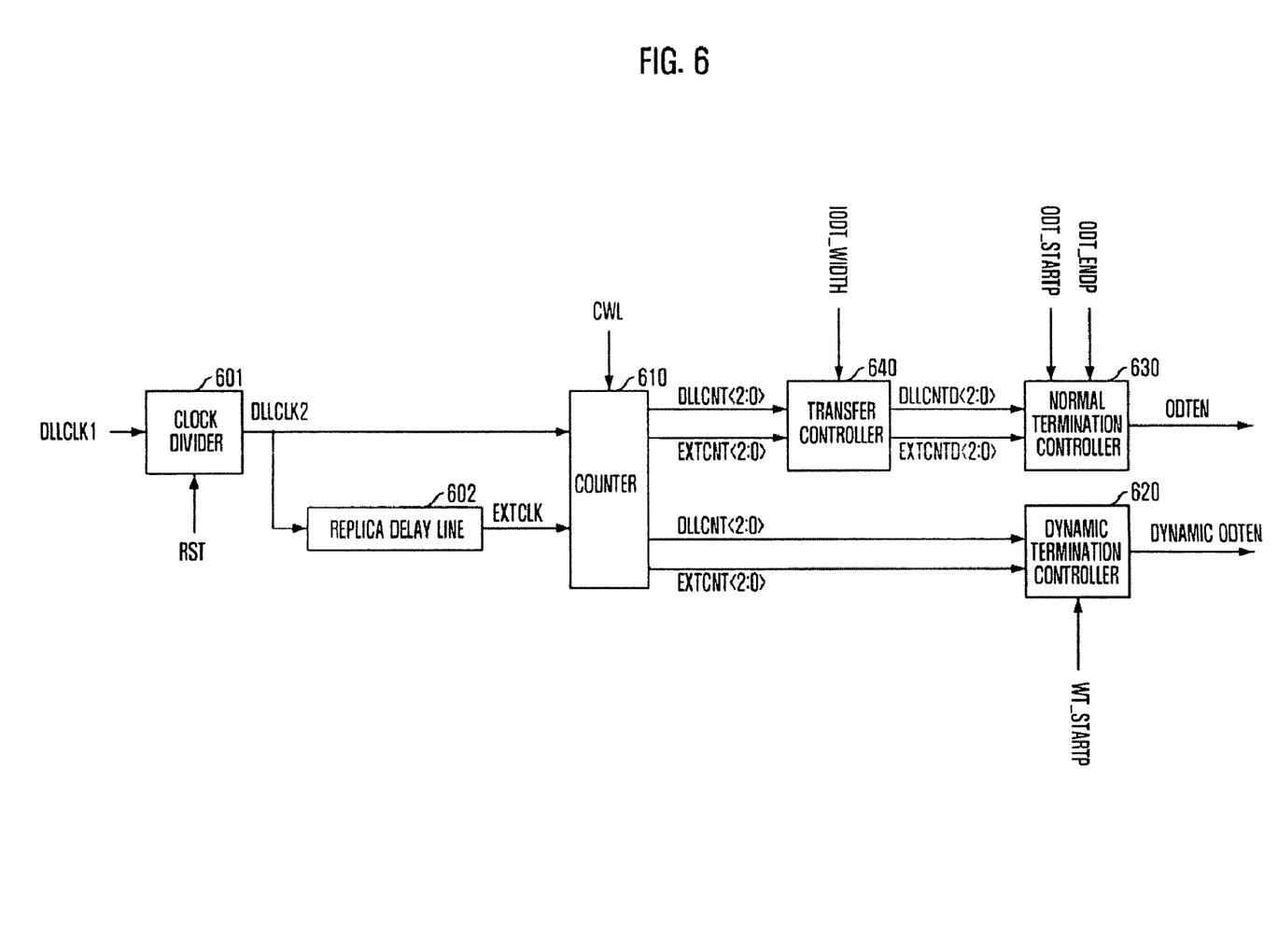
FIG. 6 is a block diagram illustrating an ODT control circuit of a semiconductor memory device in accordance with a first embodiment of the present invention.

FIG. 6 is a block diagram illustrating an ODT control circuit of a semiconductor memory device in accordance with a first embodiment of the present invention.

The first embodiment of the present invention exemplarily illustrates a technology for reducing the amount of current that is unnecessarily consumed in a normal termination controller 630. The ODT control circuit in accordance with the first embodiment of the present invention includes a counter 610, a transfer controller 640, and a normal termination controller 630. The counter 610 counts an external clock EXTCLK to output a first code EXTCNT<2:0>, and counts an internal clock DLLCLK2 to output a second code DLLCNT<2:0>. The transfer controller 640 is responsive to a termination command IODT_WIDTH to determine whether to transfer the first code EXTCNT<2:0> and the second code DLLCNT<2:0> to the normal termination controller 630. Herein, the termination command IODT_WIDTH is generated by an ODT command. The normal termination controller 630 compares the first code EXTCNTD<2:0> and the second code DLLCNTD<2:0>, which are transferred from the transfer controller 640, to determine enabling/disabling timings of termination operation in response to termination commands ODT_STARTP and ODT_ENDP. The termination commands ODT_STARTP and ODT_ENDP are also generated by the ODT command.

The ODT control circuit of the first embodiment further includes a clock divider 601, a replica delay line 602, and a dynamic termination controller 620, which are similar to those of the conventional ODT control circuit.

The clock divider 601 supplies the internal clock DLLCLK2 to the ODT control circuit. The replica delay line 602 receives the internal clock DLLCLK2 to generate the external clock EXTCLLK. The clock divider 601 and the replica delay line 602 are the same as those of the conventional ODT control circuit. These have been fully described in BACKGROUND OF THE INVENTION with reference to FIG. 1, and thus further description for them will be omitted herein.

The counter 610 counts the external clock EXTCLK to output the first code EXTCNT<2:0>, and counts the internal clock DLLCLK2 to output the second code DLLCNT<2:0>. The present invention relates to a technology for reducing current consumption by controlling the transfer of the first and second codes EXTCNT<2:0> and DLLCNT<2:0> which are generated in the same manner as the conventional ODT control circuit. Therefore, the conventional counter (see 110 of FIG. 1) may be still used as the counter 610 of the ODT control circuit in accordance with the present invention.

The transfer controller 640 is responsive to the termination command IODT_WIDTH to determine whether to transfer the first and second codes EXTCNT<2:0> and DLLCNT<2:0> to the normal termination controller 630. During a period when the termination command IODT_WIDTH is not input, the normal termination controller 630 does not control enabling/disabling of the termination operation anyway, and thus the termination operation is disabled. Accordingly, there is no problem in operation even though the first and second codes EXTCNT<2:0> and DLLCNT<2:0> are not transferred to the normal termination controller 630 during this period.

The termination command IODT_WIDTH input to the transfer controller 640 and the termination commands ODT_STARTP and ODT_ENDP input to the normal termination controller 630 are originated from the same source. As described already with reference to FIG. 4, the ODT_STARTP and ODT_ENDP signals are generated using a termination command ODT input from a memory controller. The IODT_WIDTH signal input to the transfer controller 640 is also generated using this ODT signal. However, the IODT_WIDTH signal is less delayed than the ODT_STARTP and ODT_ENDP signals, and also has a pulse width greater than the termination command ODT.

In detail, the IODT_WIDTH signal is activated little earlier than the ODT_STARTP signal, but is deactivated slightly less later than the ODT_ENDP signal. This makes it possible to secure a margin and to transfer the first and second codes EXTCNT<2:0> and DLLCNT<2:0> while the ODT_STARTP and ODT_ENDP signals are input to the normal termination controller 630.

The IODT_WIDTH signal input to the transfer controller 640 will be more fully described later with referent to the accompanying drawing.

While the transfer controller 640 of the first embodiment determines only whether to transfer the first and second codes EXTCNTD<2:0> and DLLCNTD<2:0> input to the normal termination controller 630, it does not control the first and second codes EXTCNT<2:0> and DLLCNT<2:0> input to the dynamic termination controller 620. This is because the first embodiment only illustrates the technology for reducing current consumption in the normal termination controller 630. The transfer controller 640 may be designed to determine whether to transfer the first and second codes EXTCNT<2:0> and DLLCNT<2:0> to the dynamic termination controller 620, which will be descried in a second embodiment later.

The normal termination controller 630 receives the first and second codes EXTCNTD<2:0> and DLLCNTD<2:0> from the transfer controller 640, and then compares them with each other to thereby control enabling/disabling of the termination operation. Since the first and second codes EXTCNT<2:0> and DLLCNT<2:0> are received through the transfer controller 640, the normal termination controller 630 does not always receive the first and second codes EXTCNTD<2:0> and DLLCNTD<2:0> but receive the first and second codes EXTCNTD<2:0> and DLLCNTD<2:0> only if necessary, which differs from the conventional ODT control circuit. Consequently, while the normal termination controller 630 does not receive the first and second codes EXTCNTD<2:0> and DLLCNTD<2:0>, current consumption caused by toggling of the first and second codes EXTCNTD<2:0> and DLLCNTD<2:0> does not occur.

The normal termination controller 630 may operate and be designed similarly to the conventional normal termination controller except that it does not always receive the first and second codes EXTCNTD<2:0> and DLLCNTD<2:0> because it receives the first and second codes EXTCNTD<2:0> and DLLCNTD<2:0> from the transfer controller 640. The transfer controller 640 stores the first code EXTCNTD<2:0> at an enabling timing of the termination command, i.e., an enabling timing of the ODT_STARTP signal, and enables the termination operation at a timing when a stored value of the first code EXTCNT<2:0> equals to a value of the second code DLLCNT<2:0>. Also, the transfer controller 640 stores the first code EXTCNTD<2:0> at a disabling timing of the termination command, i.e., an enabling timing of the ODT_ENDP signal, and disables the termination operation at a timing when a stored value of the first code EXTCNT<2:0> equals to a value of the second code DLLCNT<2:0>. Operation of the normal termination controller 630 has been already described in detail in BACKGROUND OF INVENTION, and thus further description for it will be omitted herein.

The dynamic termination controller 620 compares the first and second codes EXTCNT<2:0> and DLLCNT<2:0> to control enabling/disabling timings of the dynamic termination operation in response to a write command WT_STARTP. The first embodiment is directed to reducing current consumption in the normal termination controller 630, and a technology for reducing current consumption in the dynamic termination controller 620 will be described in the second embodiment. Hence, in the ODT control circuit of the first embodiment, the dynamic termination controller 620 is configured such that it directly receives the first and second codes EXTCNT<2:0> and DLLCNT<2:0> from the counter 610, not through the transfer controller 630. That is, the conventional dynamic termination controller (see 120 of FIG. 1) may be still used as the dynamic termination controller 620 of the first embodiment. Operation of the dynamic termination controller 620 has been already described in detail in BACKGROUND OF INVENTION, and thus further description for it will be omitted herein.

Figure 7:
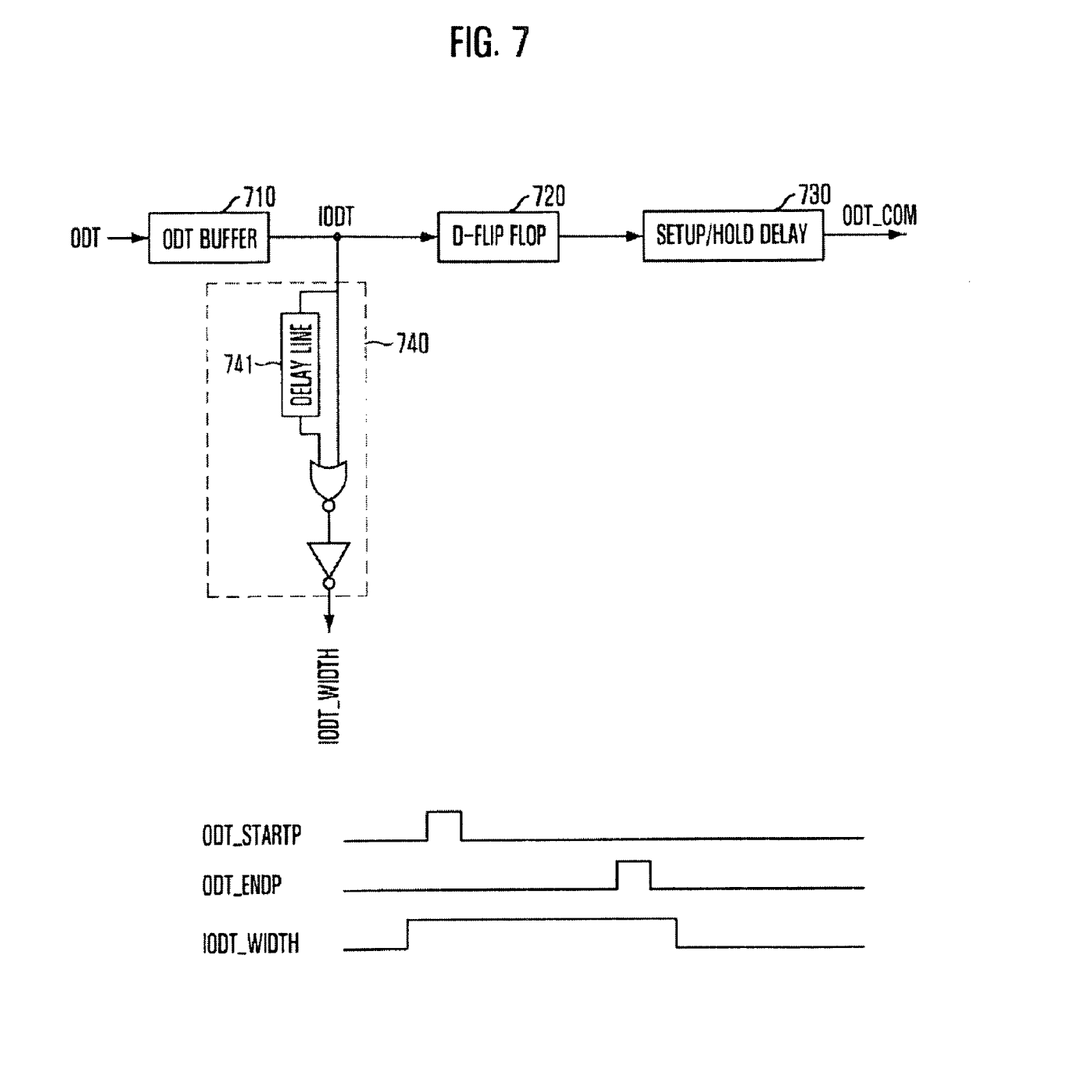
FIG. 7 illustrates a relation between a termination command IODT_WIDTH input to a transfer controller 640 and termination commands ODT_STARTP and ODT_ENDP input to a normal termination controller 630 in FIG. 6.

FIG. 7 illustrates a relation between the termination command IODT_WIDTH input to the transfer controller 640 and the termination commands ODT_STARTP, ODT_ENDP input to the normal termination controller 630.

When the termination command ODT is input from an external memory controller, an ODT buffer buffers the termination command ODT to output an IODT signal. The IODT signal is synchronized with a clock by a D-flip flop 720, and then input to a setup/hold delay 730 so that the ODT_COM signal is generated. At this time, the ODT_STARTP and ODT_ENDP signals are also generated, which are respectively activated at activation/deactivation timings of the ODT_COM signal. That is, the termination command input from the outside is changed into the termination command signals ODT_STARTP and ODT_ENDP input to the normal termination controller 630, while passing through the ODT buffer 710, the D-flip flop 720 and the setup/hold delay 730. This is fully illustrated in FIG. 4, and details are thus referred to FIG. 4.

The termination command signal IODT_WIDTH input to the transfer controller 640 is generated using the IODT signal of the ODT buffer 710. The IODT signal is activated little earlier than the ODT_STARTP signal and the ODT_ENDP signal because it is not synchronized with a clock yet and does not pass through the setup/hold delay 730. This IODT signal is input to a pulse width modulator 740 to be an IODT_WIDTH signal with a large pulse width, which is used as the termination command signal input to the transfer controller 640. The pulse width modulator 740 performs an OR operation on the IODT signal and a delayed IODT signal via a delay line 741, thereby broadening the pulse width. As a result, the pulse width of the IODT signal is broadened to an extent corresponding to a delay width of the delay line 741.

That is, the IODT_WIDTH signal input to the transfer controller 640 and the ODT_STARTP and ODT_ENDP signals input to the normal termination controller 630 are basically identical to each other except that the termination command signal IODT_WIDTH passes through the delay line 741 but the termination commands signals ODT_STARTP and ODT_ENDP do not pass through the delay line 741.

In a timing diagram at the lower part of FIG. 7, timing differences between the IODT_WIDTH signal and the ODT_STARTP and ODT_ENDP signals are illustrated. From FIG. 7, it can be observed that the IODT_WIDTH signal is activated earlier than the ODT_STARTP signal but deactivated later than the ODT_ENDP signal. In more detail, the IODT signal is activated earlier than the ODT_STARTP signal, but deactivated later than the ODTEN signal (see FIGS. 6 and 4). Accordingly, the normal termination controller 630 can secure a sufficient margin during its operation period, and can receive the first and second codes EXTCNTD<2:0> and DLLCNTD<2:0>.

Figure 8A:
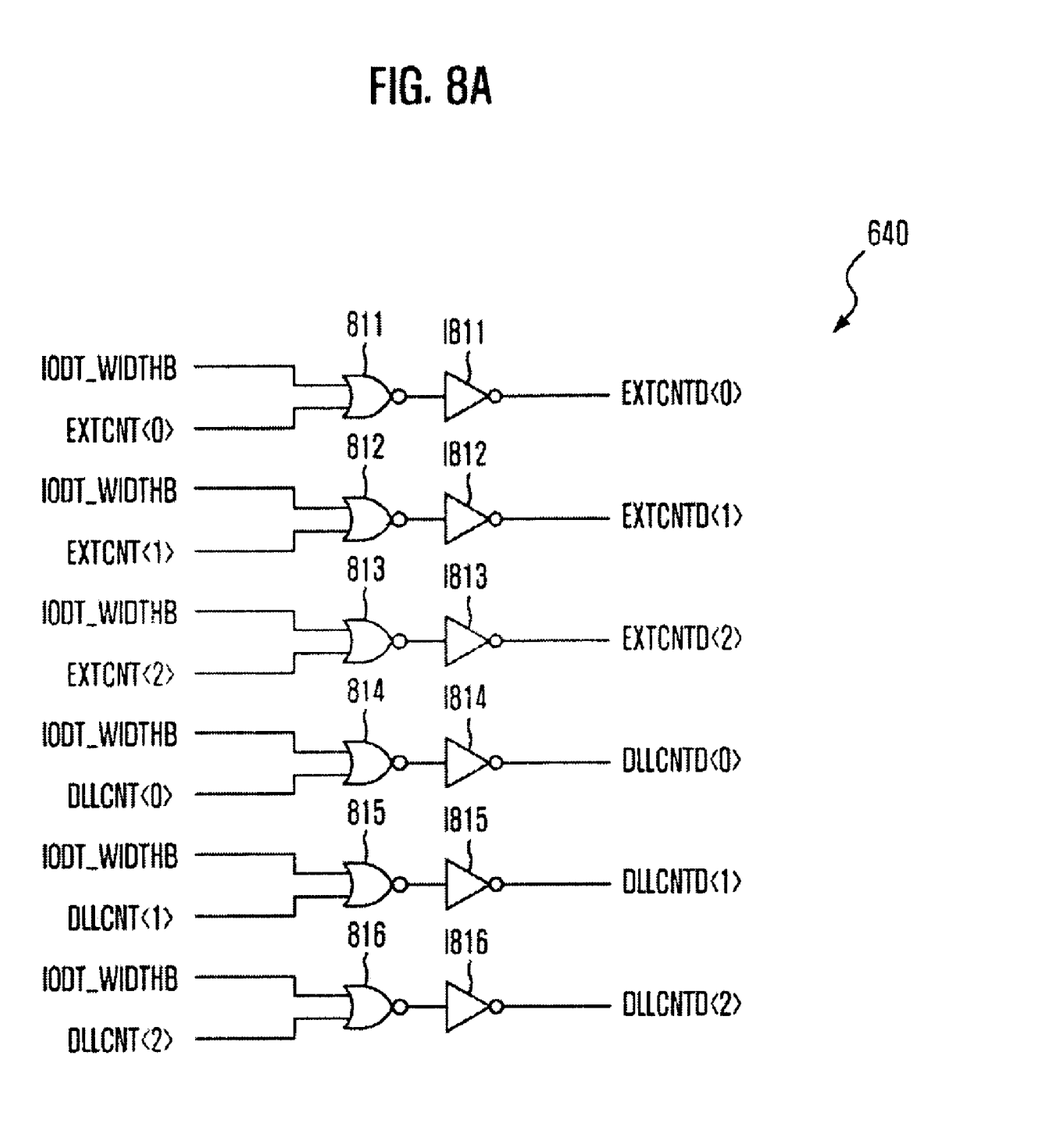
FIGS. 8A and 8B are circuit diagrams of the transfer controller 640 in FIG. 6.
Figure 8B:
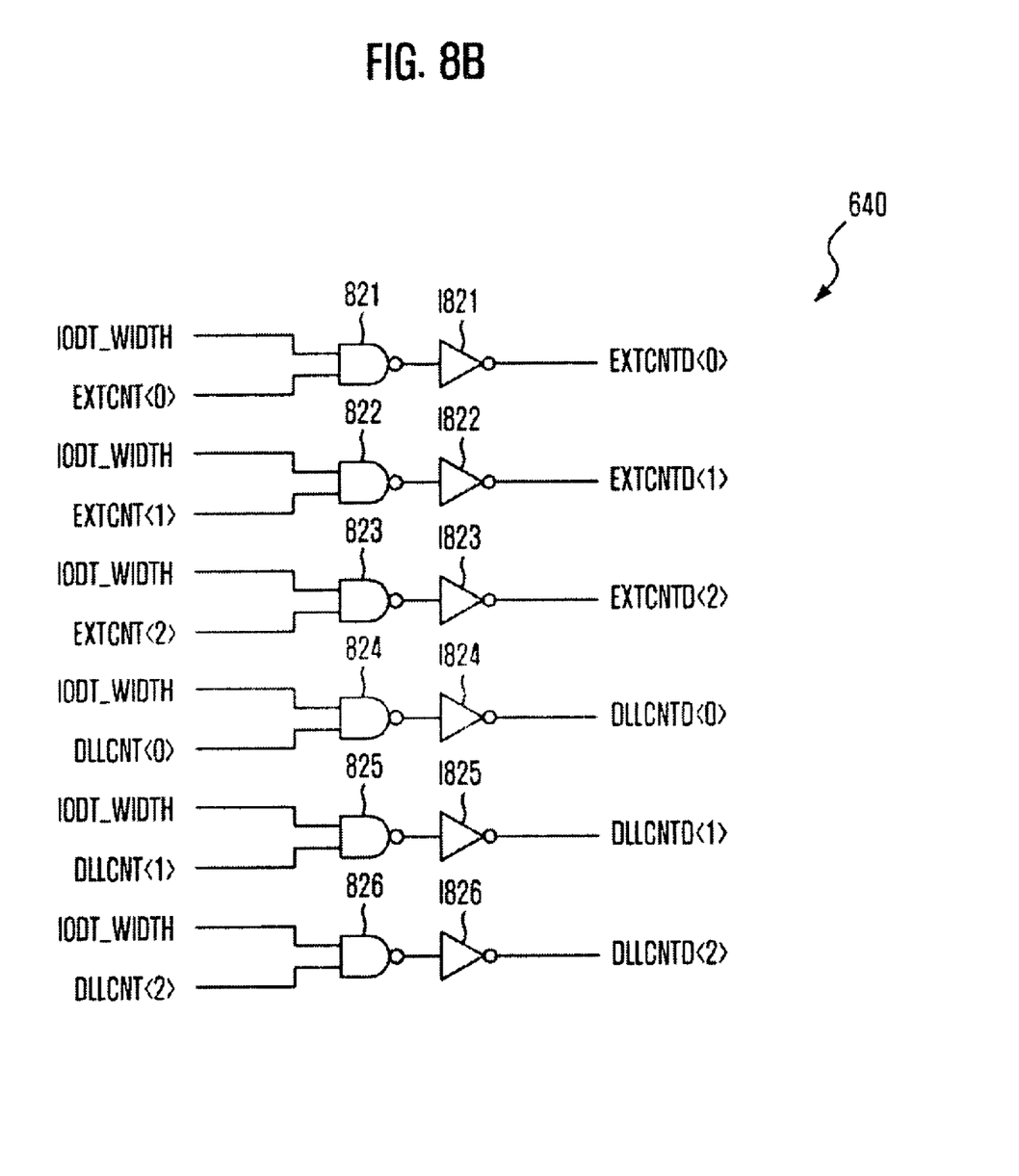

FIGS. 8A and 8B are circuit diagrams of the transfer controller 640 in FIG. 6.

Specifically, FIG. 8A illustrates the transfer controller 640 configured with NOR gates 811 to 816, and FIG. 8B illustrates the transfer controller 640 configured with NAND gates 821 to 826.

In the transfer controller 640 configured with NOR gates 811 to 816 as illustrated in FIG. 8A, when the termination command IODT_WIDTH is activated to a logic high level, a termination command bar signal IODT_WIDTHB goes to a logic low level because the termination command bar signal IODT_WIDTHB is an inversion signal of the termination command IODT_WIDTH. Therefore, the NOR gates 811 to 816 invert the first and second codes EXTCNT<2:0> and DLLCNT<2:0>, and inverters I811 to I816 invert the outputs of the NOR gates 811 to 816 to output the first and second codes EXTCNTD<2:0> and DLLCNTD<2:0> which are the same as the first and second codes EXTCNT<2:0> and DLLCNT<2:0>. On the contrary, when the termination command IODT_WIDTH is deactivated to a logic low level, the termination command bar signal IODT_WIDTHB goes to a logic high level. As a result, the NOR gates 811 to 816 always output low-level signals regardless of values of the first and second codes EXTCNT<2:0> and DLLCNT<2:0>. Accordingly, the outputs of the inverters I811 to I816 always have a logic high value regardless of the values of the first and second codes EXTCNT<2:0> and DLLCNT<2:0>, so that they do not toggle. That is, the first and second codes EXTCNT<2:0> and DLLCNT<2:0> are not transferred to the normal termination controller 630.

In the transfer controller 640 configured with NAND gates 821 to 826 as illustrated in FIG. 8B, when the termination command IODT_WIDTH is activated to a logic high level, the NAND gates 821 to 826 invert the first and second codes EXTCNT<2:0> and DLLCNT<2:0>, and inverters I821 to I826 invert the outputs of the NAND gates 821 to 826 to output the first and second codes EXTCNTD<2:0> and DLLCNTD<2:0> which are the same as the first and second codes EXTCNT<2:0> and DLLCNT<2:0>. On the contrary, when the termination command IODT_WIDTH is deactivated to a logic low level, the NAND gates 821 to 826 always output high-level signals regardless of values of the first and second codes EXTCNT<2:0> and DLLCNT<2:0>. Accordingly, the outputs of the inverters I821 to I826 always have a logic low value so that they do not toggle. That is, the first and second codes EXTCNT<2:0> and DLLCNT<2:0> are not transferred to the normal termination controller 630.

In this way, the transfer controller 640 transfers or does not transfer the first and second codes EXTCNT<2:0> and DLLCNT<2:0> to the normal termination controller 630 according to the termination command IODT_WIDTH.

Figure 9:
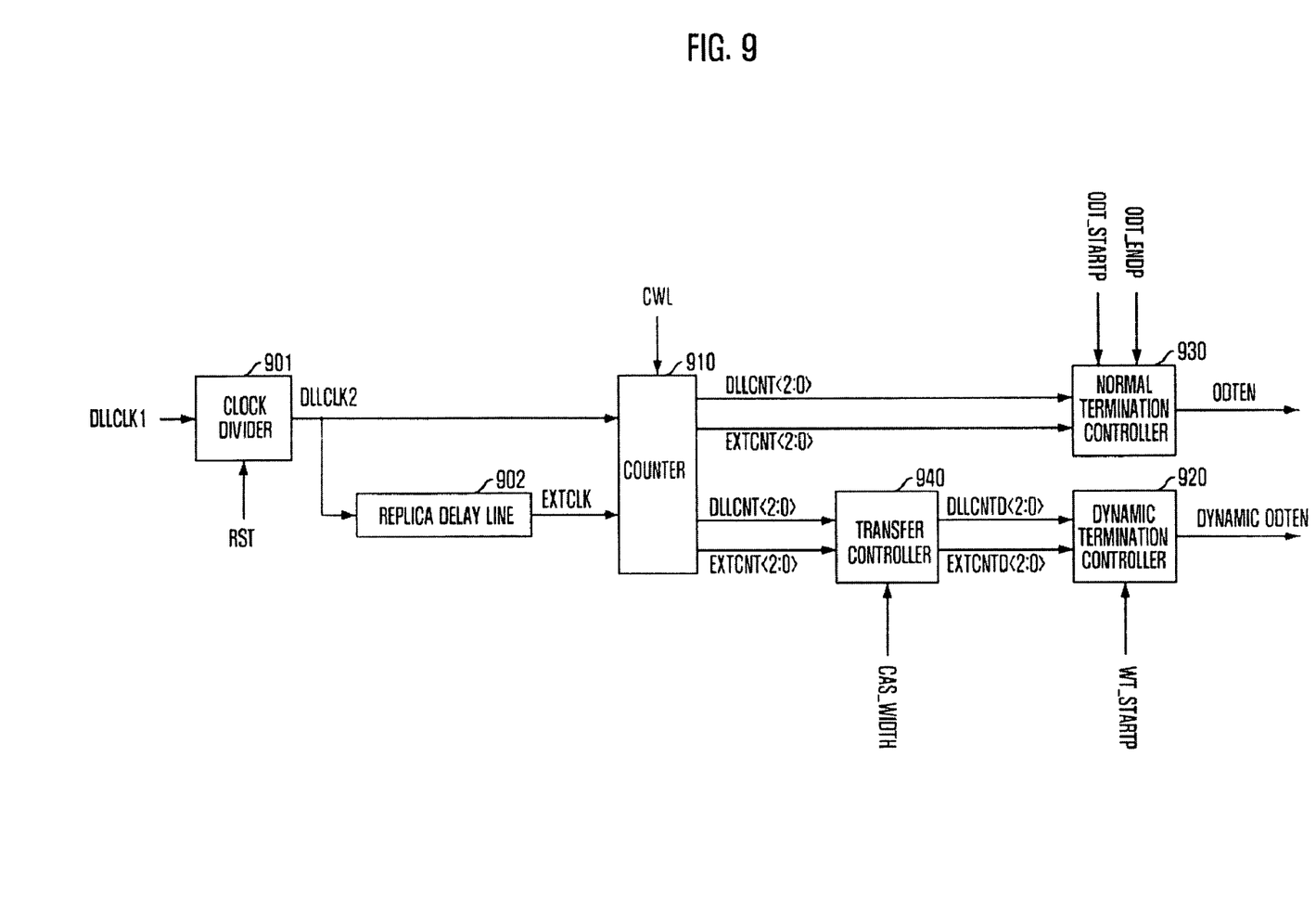
FIG. 9 is a block diagram illustrating an ODT control circuit of a semiconductor memory device in accordance with a second embodiment of the present invention.

FIG. 9 is a block diagram illustrating an ODT control circuit of a semiconductor memory device in accordance with a second embodiment of the present invention.

The second embodiment of the present invention exemplarily illustrates a technology for reducing the amount of current that is unnecessarily consumed in a dynamic termination controller. The ODT control circuit in accordance with the second embodiment of the present invention includes a counter 910, a transfer controller 940, and a dynamic termination controller 920. The counter 910 counts an external clock EXTCLK to output a first code EXTCNT<2:0>, and counts an internal clock DLLCLK2 to output a second code DLLCNT<2:0>. The transfer controller 940 is responsive to a write command CAS_WIDTH to transfer the first code EXTCNT<2:0> and the second code DLLCNT<2:0> for a predetermined time after the write command is input. The dynamic termination controller 920 compares the first code EXTCNT<2:0> and the second code DLLCNT<2:0>, which are transferred from the transfer controller 940, to determine enabling/disabling timings of dynamic termination operation in response to a write command WT_STARTP.

A clock divider 901, a replica delay line 902, a normal termination controller 930 and a clock divider 910 of the ODT control circuit of the second embodiment are identical those of the ODT control circuit of the first embodiment, and thus further description for them will be omitted herein.

Also, since the second embodiment is directed to a technology for reducing current consumption in the dynamic termination controller 920, the normal termination controller 930 directly receives the first and second codes EXTCNT<2:0> and DLLCNT<2:0> from the counter 910, like the conventional normal termination controller (see 130 of FIG. 1). Of course, although the normal termination controller 930 of the second embodiment may be configured to receive the first and second codes EXTCNT<2:0> and DLLCNT<2:0> from the transfer controller 940 like the first embodiment, the technology for reducing current consumption only in the dynamic termination controller 920 will be described in the second embodiment below.

The transfer controller 940 is responsive to the write command CAS_WIDTH to determine whether to transfer the first and second codes EXTCNT<2:0> and DLLCNT<2:0> to the dynamic termination controller 920. The first and second codes EXTCNT<2:0> and DLLCNT<2:0> are transferred to the dynamic termination controller 920 during a predetermined period after a write command CAS is input, whereas they are not transferred to the dynamic termination controller 920 during the other periods than the predetermined period. The CAS_WIDTH signal is activated for a predetermined time when the write command CAS is input from a memory controller. Therefore, the meaning the first and second codes EXTCNT<2:0> and DLLCNT<2:0> are transferred in response to the CAS_WIDTH signal is that the first and second codes EXTCNT<2:0> and DLLCNT<2:0> are transferred for the predetermined time after the write command CAS is input. The CAS_WIDTH signal input to the transfer controller 940 and the WT_STARTP signal input to the dynamic termination controller 920 are originated from the same source. The only different is that the CAS_WIDTH signal is less delayed than the WT_STARTP signal and has a large pulse width to ensure a time taken for the transfer controller 940 to transfer the first and second codes EXTCNT<2:0> and DLLCNT<2:0>.

Figure 10:
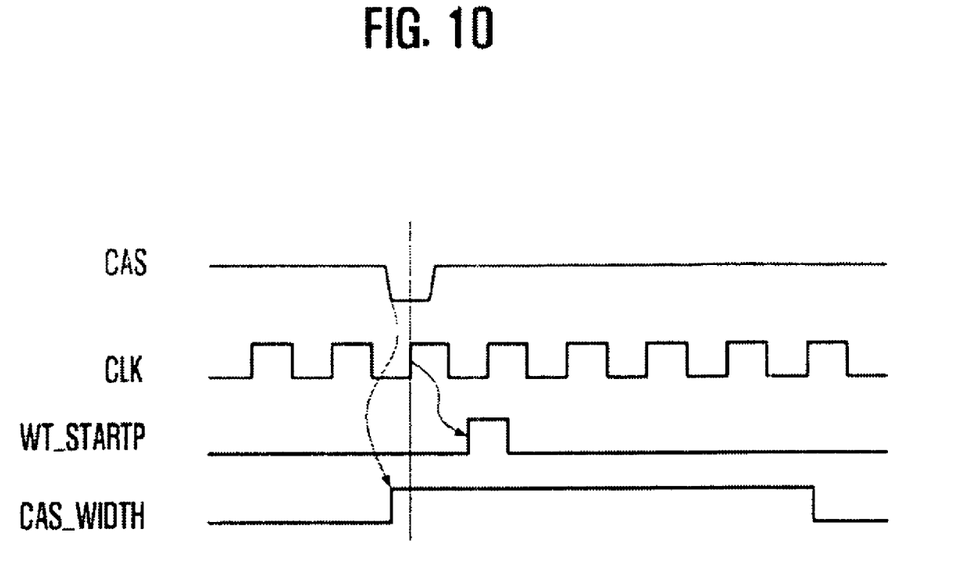
FIG. 10 is a timing diagram illustrating the relation between a CAS_WIDTH signal and a WT_STARTP signal.

FIG. 10 is a timing diagram illustrating the relation between the CAS_WIDTH signal and the WT_STARTP signal. As described already in BACKGROUND OF INVENTION, the WT_STARTP signal is a signal obtained by synchronizing the CAS command with a clock and delaying it by a predetermined delay time. The CAS_WIDTH signal is activated to a logic high level when the CAS command is activated to a logic low level, and its activation pulse width is broadened. In detail, since the pulse width of the CAS_WIDTH determines a time taken for the first and second codes EXTCNT<2:0> and DLLCNT<2:0> to be transferred to the dynamic termination controller 920, the pulse width of the CAS_WIDTH should be modulated such that the CAS_WIDTH is activated with a sufficient margin until a DYNAMIC ODTEN signal (see FIG. 2) is deactivated. This means that the pulse width of the CAS_WIDTH should be equal to at least an operating time of the dynamic termination controller 920 with a slight margin added.

As illustrated in FIG. 10, a scheme of generating the CAS_WIDTH signal from the CAS signal is obvious to a person having ordinary skill in the art, and thus further description for it will be omitted herein.

Referring back to FIG. 9, the transfer controller 940 of the second embodiment differs from that of the first embodiment in that the transfer of the first and second codes EXTCNT<2:0> and DLLCNT<2:0> is controlled in response to the write command CAS_WIDTH, however, the transfer controller 940 of the second embodiment has the same function as that of the first embodiment because both of them control the transfer of the first and second codes EXTCNT<2:0> and DLLCNT<2:0>. Hence, the transfer controller 940 of the second embodiment may be designed in the same manner of FIG. 8. Only different is that the IODT_WIDTH signal is replaced with the CAS_WIDTH signal and the IODT_WIDTHB signal is replaced with the CAS_WIDTHB signal in FIG. 8.

The dynamic termination controller 920 compares the first code EXTCNTD<2:0> and the second code DLLCNTD<2:0>, which are transferred from the transfer controller 940, to control enabling/disabling of the dynamic termination operation in response to the write command WT_STARTP. The dynamic termination operation is enabled at a timing when a value of the first code EXTCNTD<2:0> at an activation timing of the write command WT_STARTP is stored in response to the write command WT_STARTP and the stored value of the first code EXTCNT<2:0> is equal to a value of the second code DLLCNT<2:0>. The dynamic operation is disabled at a timing when the stored value of the first code EXTCNT<2:0> with a predetermined value according to a burst length added is equal to the value of the second code DLLCNT<2:0>. The dynamic termination controller 920 operates in the same manner as the conventional dynamic termination controller (see 120 of FIG. 1) except that the dynamic termination controller 920 of the second embodiment does not directly receive the first and second codes EXTCNT<2:0> and DLLCNT<2:0> from the counter 910, but receives them from the transfer controller 940. Since operation of the conventional dynamic termination controller (120 of FIG. 1) has been already described in BACKGROUND OF INVENTION, further description for it will be omitted herein.

The dynamic termination controller 920 of the second embodiment receives the first and second codes EXTCNT<2:0> and DLLCNT<2:0> only during a predetermined period when the first and second codes EXTCNT<2:0> and DLLCNT<2:0> are needed, but does not receive the first and second codes EXTCNT<2:0> and DLLCNT<2:0> during other periods than the predetermined period. Therefore, there is no unnecessary current consumption caused by toggling of the first and second codes EXTCNT<2:0> and DLLCNT<2:0>.

Figure 11:
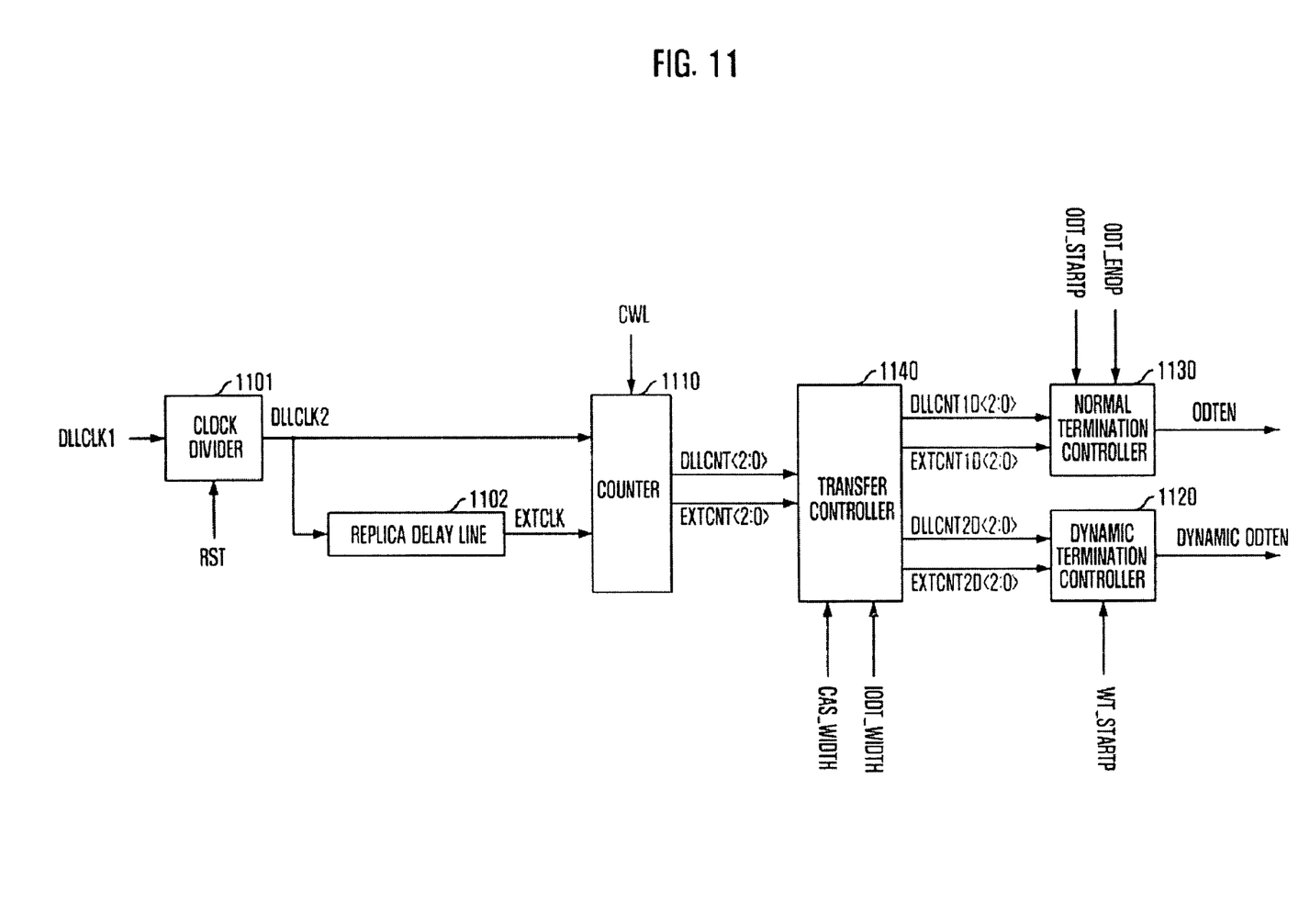
FIG. 11 is a block diagram illustrating an ODT control circuit of a semiconductor memory device in accordance with a third embodiment of the present invention.

FIG. 11 is a block diagram illustrating an ODT control circuit of a semiconductor memory device in accordance with a third embodiment of the present invention.

Hitherto, the first embodiment of FIG. 6 illustrated the technology for reducing current consumption in the normal termination controller 630, and the second embodiment of FIG. 9 illustrated the technology for reducing current consumption in the dynamic termination controller 920. In the third embodiment, there is provided a technology to which both the technologies of the first and second embodiments are applied.

The ODT control circuit in accordance with the third embodiment of the present invention includes a counter 1110, a transfer controller 1140, a dynamic termination controller 1120, and a normal termination controller 1130. The counter 1110 counts an external clock EXTCLK to output a first code EXTCNT<2:0>, and counts an internal clock DLLCLK2 to output a second code DLLCNT<2:0>. The transfer controller 1140 is responsive to a termination command IODT_WIDTH to determine whether to transfer the first code EXTCNT<2:0> and the second code DLLCNT<2:0> to the normal termination controller 1130, and is responsive to a write command CAS_WIDTH to determine whether to transfer the first code EXTCNT<2:0> and the second code DLLCNT<2:0> for a predetermined time after the write command is input. The normal termination controller 1130 compares the first code EXTCNT<2:0> and the second code DLLCNT<2:0>, which are transferred from the transfer controller 1140, to determine enabling/disabling timings of termination operation in response to termination commands ODT_STARTP and ODT_ENDP. The dynamic termination controller 1120 compares the first code EXTCNT<2:0> and the second code DLLCNT<2:0>, which are transferred from the transfer controller 1140, to determine enabling/disabling timings of dynamic termination operation in response to a write command WT_STARTP.

The third embodiment of FIG. 11 is a combination of the technologies of FIGS. 6 and 9. Therefore, the transfer controller 1140 includes the transfer controller (640 of FIG. 6) of the first embodiment, and the transfer controller (940 of FIG. 9) of the second embodiment. The normal termination controller 1130 has the same configuration and operates in the same manner as the normal termination controller (630 of FIG. 6) of the first embodiment, and the dynamic termination controller 1120 has the same configuration and operates in the same manner as the dynamic termination controller (1120 of FIG. 9) of the second embodiment.

Although the first and second codes EXTCNT<2:0> and DLLCNT<2:0>, which are respectively transferred to the normal termination controller 1130 and the dynamic termination controller 1120 by the transfer controller 1140, are equal, the first and second codes EXTCNT<2:0> and DLLCNT<2:0> transferred to the normal termination controller 1130 differ in their timings from those transferred to the dynamic termination controller 1120. Hence, in FIG. 11, the first code transferred to the normal termination controller 1130 is represented as EXTCNT1D<2:0>, and the first code transferred to the dynamic termination controller 1120 is represented as EXTCNT2D<2:0>. Likewise, the second code transferred to the normal termination controller 1130 is represented as DLLCNT1D<2:0>, and the second code transferred to the dynamic termination controller 1120 is represented as DLLCNT2D<2:0>.

Since the ODT control circuit of the third embodiment has both the characteristics of the first and second embodiments, the ODT control circuit does not receive the first and second codes EXTCNT<2:0> and DLLCNT<2:0> when the normal termination controller 1130 and the dynamic termination controller 1120 do not operate, respectively. Accordingly, the normal termination controller 1130 and the dynamic termination controller 1120 do not consume current unnecessarily due to toggling of the first and second codes EXTCNT<2:0> and DLLCNT<2:0>.

Operation of the ODT control circuit in accordance with the third embodiment can be apprehended from the foregoing descriptions for the first and second embodiments, and thus duplicate description will be omitted herein.

As described above, in accordance with the present invention, first and second codes are transferred to a normal termination controller and a dynamic termination controller only if necessary, which significantly differs from the conventional ODT control circuit where the first and second codes are always input to the normal termination controller and the dynamic termination controller.

Therefore, it is possible to prevent unnecessary power consumption while enabling/disabling of termination operation are not controlled.

While the present invention has been described with respect to the specific embodiments, it will be apparent to those skilled in the art that various changes and modifications may be made without departing from the spirit and scope of the invention as defined in the following claims.

What is claimed is:

1. An on-die termination (ODT) control circuit of a semiconductor device, comprising:
    a counter configured to count a delayed internal clock to output a first code, and to count an internal clock to output a second code;
    a transfer controller configured to determine whether to transfer the first code and the second code in response to a first termination command; and
    a normal termination controller configured to determine enabling/disabling timings of a termination operation in response to a value of the first code and a value of the second code at an activation timing of a second termination command.

2. The ODT control circuit as recited in claim 1, wherein the second termination command and the first termination command originate from the same source, the second termination command being delayed relative to the first termination command.

3. The ODT control circuit as recited in claim 2, wherein the first termination command has a pulse width of an activation period larger than that of the second termination command input, thereby securing a margin.

4. The ODT control circuit as recited in claim 1, wherein the first termination command is activated earlier than the second termination command and is inactivated later than the second termination command.

5. The ODT control circuit as recited in claim 1, wherein the normal termination controller stores a value of the first code at an activation timing of the second termination command, and enables the termination operation at a timing when the stored value of the first code is equal to a value of the second code; and
    the normal termination controller stores a value of the first code at an activation timing of the second termination command, and disables the termination operation at the timing when the stored value of the first code is equal to the value of the second code.

6. The ODT control circuit as recited in claim 1, wherein the first and second codes start to be counted in response to a deactivation of a reset signal, and an initial value of the second code is determined depending on a CAS write latency (CWL).

7. The ODT control circuit as recited in claim 1, wherein the transfer controller comprises logic gates for transferring or interrupting the first code and the second code in response to the first termination command.

8. The ODT control circuit as recited in claim 1, wherein the internal clock is an output clock of a delay locked loop (DLL), and the delayed internal clock is generated by delaying the internal clock through a replica delay line.

9. An ODT control circuit of a semiconductor device, comprising:
   a counter configured to count a delayed internal clock to output a first code, and to count an internal clock to output a second code;
   a transfer controller configured to be responsive to a first write command to transfer the first code and the second code for a predetermined time after the first write command; and
   a dynamic termination controller configured to determine enabling/disabling timings of a dynamic termination operation in response to a value of the first code and a value of the second code at an activation timing of a second write command.

10. The ODT control circuit as recited in claim 9, wherein the second write command and the first write command originate from the same source but the second write command is delayed relative to the first write command.

11. The ODT control circuit as recited in claim 10, wherein the first write command has a pulse width of an activation period larger than that of the second write command, thereby securing a margin.

12. The ODT control circuit as recited in claim 9, wherein the dynamic termination controller is responsive to the second write command to store a value of the first code at an activation timing of the second write command, and enables the dynamic termination operation at a timing when the stored value of the first code is equal to a value of the second code; and
   the dynamic termination controller adds a predetermined value depending on a burst length to the stored value of the first code, and disables the dynamic termination operation at the timing when the stored value of the first code with the predetermined value added thereto is equal to the value of the second code.

13. The ODT control circuit as recited in claim 9, wherein the first and second codes start to be counted in response to a deactivation of a reset signal, and an initial value of the second code is determined depending on a CWL.

14. The ODT control circuit as recited in claim 9, wherein the transfer controller comprises logic gates for transferring or interrupting the first code and the second code in response to the first write command.

15. The ODT control circuit as recited in claim 9, wherein the internal clock is an output clock of a DLL, and the delayed internal clock is generated by delaying the internal clock through a replica delay line.

16. An ODT control circuit of a semiconductor device, comprising:
   a counter configured to count a delayed internal clock to output a first code, and to count an internal clock to output a second code;
   a transfer controller configured to determine whether to transfer the first code and the second code in response to a first termination command, and to be responsive to a first write command to transfer the first code and the second code for a predetermined time after the first write command is input;
   a normal termination controller configured to determine enabling/disabling timings of a termination operation in response to a value of the first code and a value of the second code transferred from the transfer controller at an activation timing of a second termination command; and
   a dynamic termination controller configured to determine enabling/disabling timings of a dynamic termination operation in response to a value of the first code and a value of the second code transferred from the transfer controller at an activation timing of a second write command.

* * * * *